(12) United States Patent  (10) Patent No.: US 9,761,420 B2
Sarkar et al.  (45) Date of Patent: Sep. 12, 2017

(54) DIFFUSION BONDED HIGH PURITY COPPER SPUTTERING TARGET ASSEMBLIES

(71) Applicants: Jaydeep Sarkar, Thiells, NY (US); Paul Gilman, Suffern, NY (US)

(72) Inventors: Jaydeep Sarkar, Thiells, NY (US); Paul Gilman, Suffern, NY (US)

(73) Assignee: PRAXAIR S.T. TECHNOLOGY, INC., North Haven, CT (US)

(*) Notice: Subject to any disclaimer, the term of this patent is extended or adjusted under 35 U.S.C. 154(b) by 521 days.

(21) Appl. No.: 14/105,589

(22) Filed: Dec. 13, 2013

(65) Prior Publication Data

US 2015/0170889 A1    Jun. 18, 2015

(51) Int. Cl.
C23C 14/00   (2006.01)
H01J 37/34   (2006.01)
C23C 14/34   (2006.01)

(52) U.S. Cl.
CPC ...... *H01J 37/3426* (2013.01); *C23C 14/3407* (2013.01); *H01J 37/34* (2013.01); *H01J 37/3435* (2013.01); *C23C 14/3414* (2013.01)

(58) Field of Classification Search
CPC .................. C23C 14/3414; H01J 37/3426
See application file for complete search history.

(56) References Cited

U.S. PATENT DOCUMENTS

| | | | |
|---|---|---|---|
| 5,836,506 A | 11/1998 | Hunt et al. | |
| 6,139,701 A | 10/2000 | Pavate et al. | |
| 6,197,134 B1 | 3/2001 | Kanzaki et al. | |
| 6,331,234 B1 | 12/2001 | Kardokus et al. | |
| 6,464,847 B1 * | 10/2002 | Kumahara | C23C 14/3407 204/298.12 |
| 6,478,902 B2 | 11/2002 | Koenigsmann et al. | |
| 6,619,537 B1 | 9/2003 | Zhang et al. | |
| 6,749,103 B1 | 6/2004 | Ivanov et al. | |
| 6,849,139 B2 | 2/2005 | Kardokus et al. | |
| 6,858,102 B1 | 2/2005 | Kardokus et al. | |
| 6,896,748 B2 | 5/2005 | Perry et al. | |
| 7,507,304 B2 | 3/2009 | Okabe et al. | |
| 7,767,043 B2 | 8/2010 | Segal et al. | |
| 8,025,749 B2 | 9/2011 | Perry et al. | |
| 2002/0112791 A1 | 8/2002 | Kardokus et al. | |

(Continued)

FOREIGN PATENT DOCUMENTS

EP    1382710 A1    1/2004

OTHER PUBLICATIONS

Antonione, C. et al. "Grain Growth and Secondary Recrystallization in Iron". Journal of Materials Science, vol. 8 (Jan. 1973) pp. 1-10.

*Primary Examiner* — Timon Wanga
(74) *Attorney, Agent, or Firm* — Nilay S. Dalal

(57) ABSTRACT

The present invention relates to novel and improved high purity diffusion bonded copper (Cu) sputtering targets having a Cu purity level of 99.9999% (6N) or greater. The target assemblies of the present invention exhibit sufficient bond strength and microstructural homogeneity, both of which are properties previously considered mutually exclusive for conventional 6N Cu target assemblies. The grain structure is characterized by an absence of alloying elements and the bonded interface is generally flat without any type of interlayer or interlocking arrangement.

18 Claims, 7 Drawing Sheets

(56) References Cited

U.S. PATENT DOCUMENTS

| | | | |
|---|---|---|---|
| 2007/0051624 A1* | 3/2007 | Okabe | C22C 9/06 |
| | | | 204/298.13 |
| 2007/0251818 A1 | 11/2007 | Yi et al. | |
| 2007/0251819 A1* | 11/2007 | Kardokus | C23C 14/3414 |
| | | | 204/298.13 |
| 2008/0116066 A1* | 5/2008 | Miyashita | C23C 14/3407 |
| | | | 204/298.12 |
| 2008/0197017 A1 | 8/2008 | Yi et al. | |
| 2009/0057139 A1* | 3/2009 | Fukushima | C23C 14/3407 |
| | | | 204/298.13 |
| 2009/0078570 A1* | 3/2009 | Yi | C23C 14/3414 |
| | | | 204/298.13 |
| 2009/0101496 A1 | 4/2009 | Yi et al. | |

\* cited by examiner

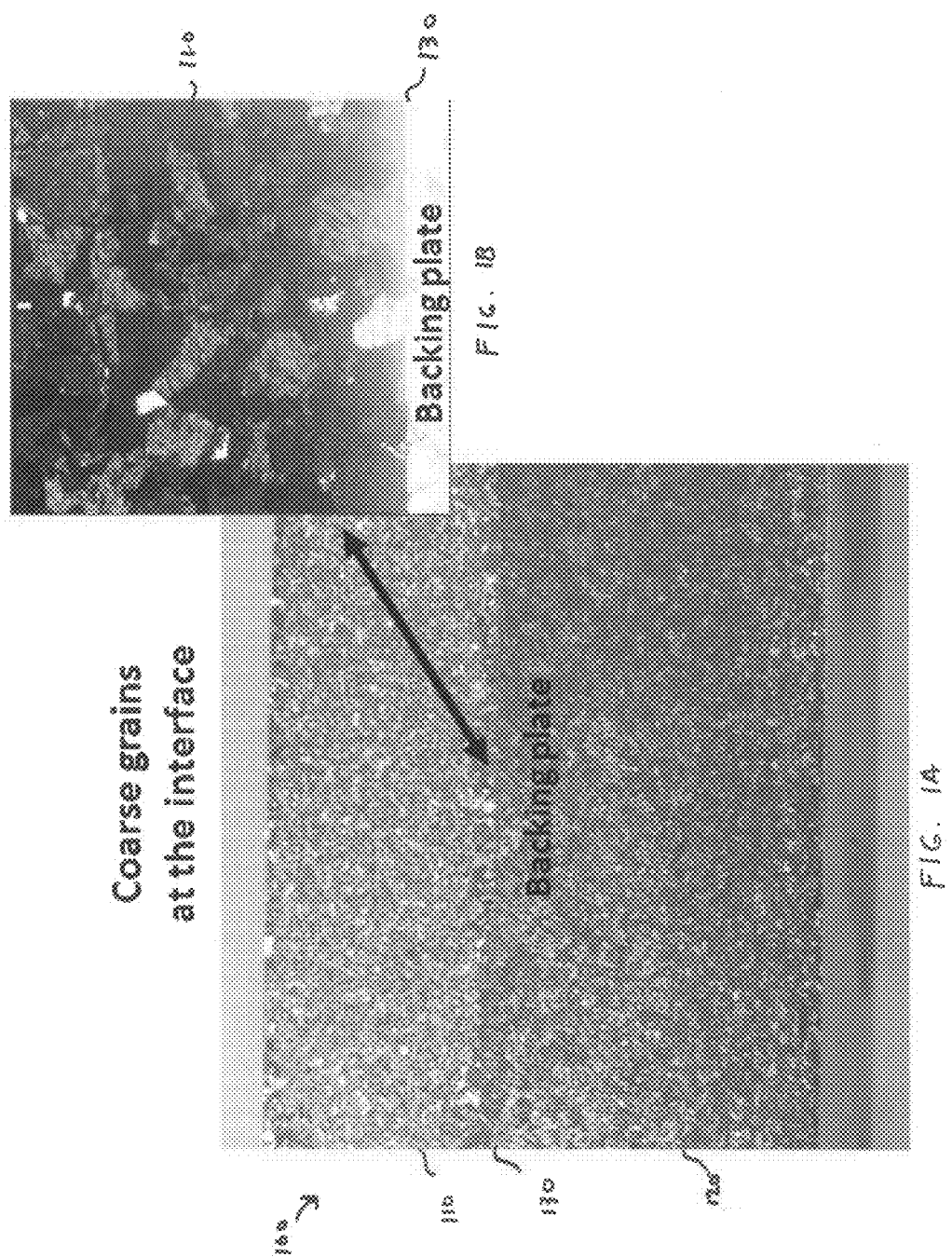

DIFFUSION BONDED HIGH PURITY COPPER SPUTTERING TARGET ASSEMBLIES

FIELD OF THE INVENTION

The present invention relates to novel and improved high purity copper sputtering targets. Particularly, the invention relates to unique diffusion bonded sputtering target assemblies having a copper purity level of 99.9999% or greater.

BACKGROUND OF THE INVENTION

High purity copper (Cu) of at least 99.999 wt. % purity (referred to as 5N Cu) is useful for producing high purity Cu interconnects for use in integrated circuits. The Cu purity of the resultant target is important to maintain the low resistivity of the Cu line. The interconnects can be created by sputtering 5N or higher purity Cu material from Cu target assemblies. The assembly can be typically prepared by diffusion bonding a high purity Cu target blank or disc to a high strength alloy backing plate. The finer grain size can improve Cu target sputter performance. For example, finer grain sizes can allow the target to sputter faster and may result in fewer particle inclusions incorporated into the deposited film. Finer grain size (e.g., 50 microns or less) can also improve resultant film properties, including the film resistivity (Rs) and thickness uniformity.

Technology advancements with integrated circuits are now driving the need for even higher purity Cu interconnects. Today's Cu interconnects require higher conductivity which is driving the need for targets of 99.9999 wt. % (6N Cu). The shift from 200 mm to 300 mm wafer necessitates 6N or higher Cu target assemblies to be significantly thicker and larger in diameter than precursor target assemblies previously employed to produce 200 mm wafers.

However, there remain design challenges for manufacturing 6N and higher Cu targets. In contrast to Cu target assemblies at a purity of 5N which contain more solutes that can effectively immobilize or pin the grain boundaries during annealing and recrystallization, the control of grain size and grain growth for 6N and higher Cu purity levels become exceedingly difficult, in part because the 6N and higher Cu purity levels cannot contain the same amount of alloying solutes as contained in the 5N Cu material. At these higher purity levels, copper is particularly susceptible to grain growth in which some grains that are scattered throughout the material grow faster than the matrix. As the grains grow, they consume smaller matrix grains until the entire structure results in a large grain size, which can be in excess of 250 microns (μm). To alleviate the grain growth problem, the high purity Cu targets can be manufactured below a critical temperature at which the onset of anomalous grain growth will not occur. However, typically the minimum temperature required for diffusion bonding to produce adequate bond strength at the target-backing plate interface is higher than the critical temperature. The bond strength must be sufficiently high such that debonding of the target from the backing plate does not occur during target sputtering. As sputtering power levels continue to increase, the need for higher bond strengths becomes more critical. Furthermore, higher power sputtering conditions generate considerable heat to cause localized grain growth at the sputtering surface of the target.

Generally speaking, unlike 5N Cu target assemblies, the ability for 6N- or higher purity Cu target assemblies to achieve and maintain fine grain size along with adequate bond strength are competing design attributes. In other words, acceptable fine grain size cannot be achieved at the expense of lower and unacceptable bond strength and vice versa at 6N or higher purity Cu target assemblies. Higher temperatures involved in diffusion bonding change the microstructure obtained during pre-bonding processing. Even if grain size and the desired random grain orientation can be achieved during manufacture of the target blank, the attributes are lost by current-diffusion bonding techniques. In fact, diffusion bonding of 6N and higher purity Cu target blanks can nearly double the grain size.

Several high purity Cu targets are currently available that attempt to offer fine grain size without incurring loss of bond strength. For example, monolithic 6N Cu targets are currently utilized. Monolithic target as recognized in the industry refers to the target not being affixed to a backing plate. In this manner, the design challenges of unacceptable bond strength are eliminated, thereby allowing the target blank to be manufactured at lower temperatures to prevent grain growth. However, the absence of a high strength backing plate means that the target can bow and cause warpage during sputtering. The problem is compounded with 6N and higher purity Cu which is being sputtered at increasingly higher power levels. Such monolithic sputter targets without backing plates become less feasible in view of the continuing increase in target diameters required for sputtering larger size wafers. As a result, 6N or higher purity monolithic Cu targets are not viable for today's demanding sputtering applications.

Several 6N or higher purity copper target-backing plate assemblies are available. However, none are inadequate. For instance, micro-alloy additions to Cu targets exceeding 99.999 wt. % have been employed in an effort to maintain and stabilize the fine-grained microstructure during elevated temperatures of diffusion bonding and subsequent sputter power levels. Although the micro-alloy additions can allow diffusion bonding at elevated temperatures to occur without grain growth at the elevated temperatures, the additions are problematic because they are a source of undesirable contaminant which is now introduced into the target. The sputter process may cause the micro-alloy additions to become incorporated into the resultant film that is deposited. Additionally, several end-use applications require utilizing target assemblies at 6N or higher purity Cu that cannot tolerate any amount of alloying introduced therein. Accordingly, the need for 6N or higher purity Cu target assemblies without alloying elements has proven challenging, as there is no resistance to movement of the grain boundaries to form large grains at the higher temperatures.

In an effort to maintain 6N or higher purity Cu target assemblies without micro-alloying, the bonding temperature must be reduced. In this regard, several high purity Cu target assemblies are available that utilize an interlayer to provide the necessary bond strength. For instance, silver interlayers are commonly utilized at the interface as part of the bonding process. However, the temperature that is required for use of a silver interlayer is sufficiently high to cause localized grain coarsening at the bond interface. Loss of microstructure control can occur. The problem also occurs with other interlayers such that the temperatures required for their use have proven too high to maintain grain structure stability.

Soldering the target to the backing plate has also been utilized, particularly those solder materials having lower melting points. However, solder bonds have proven weak and are susceptible to debonding during the sputtering operation. Furthermore, the relatively lower temperatures associated with lower melting point solders reduces the target's temperature range for sputtering. Thus, solder-bonded assemblies can only be operated at a lower power level to prevent separation of the 6N or higher purity Cu target from the backing plate. This is problematic because sputtering at reduced power levels decreases the sputtering rate.

Grooved interfaces have been used with the design objective of producing a mechanically interlocked interface which can achieve adequate bond strength without the onset of grain growth. However, grooved target interfaces contain voids at the interface that can result in poor sputtering performance as well as less material utilization of the target. Additionally, the grooves may degrade during high pressure bonding of the assembly, thereby adversely affecting the structural integrity of the bonded structure, and potentially shortening the effective lifetime of the target.

In view of the drawbacks with currently available 6N or higher purity Cu sputter targets, there is a growing need for 6N or higher purity non-alloyed Cu targets to retain fine microstructure without losing bond strength in the production of 300 mm Cu coated wafers.

SUMMARY OF THE INVENTION

The invention may include any of the following aspects in various combinations and may also include any other aspect of the present invention described below in the written description.

In a first aspect, a sputtering target assembly is provided. The assembly comprises a backing plate and a copper-containing target. The target is defined by a thickness and diameter configured to produce 300 mm wafers coated with Cu films. The target is diffusion bonded directly to the backing plate to create a substantially flat interface. The interface is characterized by the absence of an interlayer and grooves. The interface has a bond strength sufficient to prevent debonding of the target from the backing plate during sputtering at power levels of at least about 20 kW. The target consists essentially of 99.9999 wt % Cu (6N Cu) or higher and is characterized by the absence of alloying elements. The target has grains with an average grain size equal to or less than about 30 microns.

In a second aspect of the invention, a sputtering target assembly is provided. The assembly comprises a backing plate and a copper-containing target defined by a thickness and diameter configured to produce 300 mm wafers that are coated with Cu films. The target is diffusion bonded directly to the backing plate to create an interface. The interface has a bond strength sufficient to prevent debonding of the target from the backing plate during sputtering at power levels of at least about 20 kW. The target consists essentially of 99.9999 wt % Cu (6N Cu) or higher. The target is characterized by the absence of alloying stabilizer elements. The target has grains with an average grain size equal to or less than about 30 microns. The grain size has a variation of no more than about +/−2.9%. The localized microstructure at the interface is substantially similar to that of the bulk grain structure.

BRIEF DESCRIPTION OF THE DRAWINGS

The objectives and advantages of the invention will be better understood from the following detailed description of the preferred embodiments thereof in connection with the accompanying figures wherein like numbers denote same features throughout and wherein:

FIGS. 1a and 1b show a conventional 6N Cu target assembly with coarse grains at the bonded interface;

FIG. 2b is a cross-sectional macrostructure of FIG. 2a;

DETAILED DESCRIPTION OF THE INVENTION

Figure 2A:
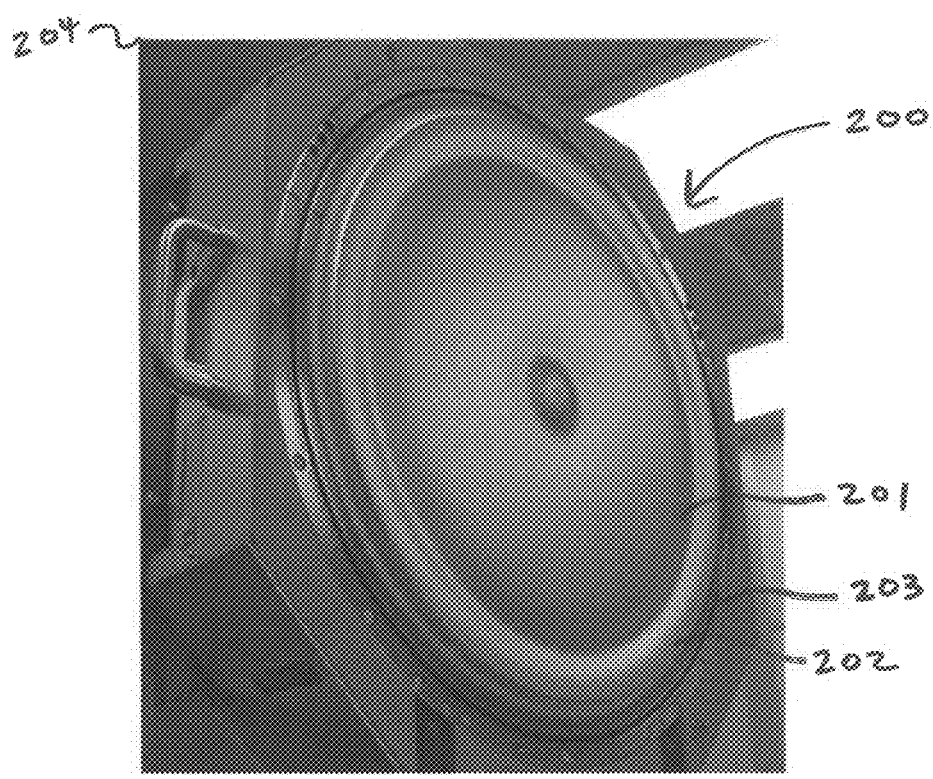
FIG. 2a shows a digital photograph of a 6N Cu target assembly in accordance with the principles of the present invention.

The objectives and advantages of the invention will be better understood from the following detailed description of the preferred embodiments thereof in connection. The present disclosure relates to novel copper-containing sputtering target assemblies. The assemblies of the present invention are particularly suitable for 300 mm wafer applications which require 6N or higher Cu purities. The disclosure is set out herein in various embodiments and with reference to various aspects and features of the invention.

The relationship and functioning of the various elements of this invention are better understood by the following detailed description. The detailed description contemplates the features, aspects and embodiments in various permutations and combinations, as being within the scope of the disclosure. The disclosure may therefore be specified as comprising, consisting or consisting essentially of, any of such combinations and permutations of these specific features, aspects, and embodiments, or a selected one or ones thereof.

As used herein and throughout the specification, it should be understood that the term "target" refers to the resultant target structure as bonded to a backing plate. Furthermore, the term "target" will be used interchangeably with "sputter target", "sputter target assembly" and "target assembly".

As used herein and throughout the specification, the term "high purity" is intended to refer to 6N or higher purity Cu.

As will be described, the present invention overcomes existing design challenges which have prevented the successful design and construction of Cu target assemblies having a purity level that is increased from 5N to at least 6N or higher. 6N or higher conventional Cu target assemblies can only produce sufficient bond strength at the expense of losing the required microstructural grain control. In this regard, and to illustrate this shortcoming of conventional 6N or higher purity target assemblies, FIG. 1a is representative of current 6N or higher Cu target assemblies which are diffusion bonded. Specifically, FIG. 1a shows a digital photograph of a conventional 6N Cu target assembly 100 including a target 110 that is diffusion bonded to a backing plate 120. The assembly 100 contains coarse grains at the interface 130 as a result of grain growth occurring at the elevated temperatures employed during diffusion bonding of the target blank to the backing plate. The coarse grains can be clearly seen by the greater magnification provided in the optical micrograph of FIG. 1b. FIG. 1b shows coarse grains of non-uniform size at the bonded interface 130. FIG. 1b also shows coarse grains contained away from the interface 130 into the bulk material of the target 110. The coarse grains increased by a factor of 2 in comparison to the grains of the target blank.

In contrast to conventional high purity copper target assemblies as shown in FIGS. 1a and 1b, the Cu target assemblies of the present invention possess adequate bond strength without losing microstructural control. As a result, the present invention is directed to high purity Cu target assemblies of 6N or higher purity that offers exceptional sputtering performance at higher sputtering power levels and lifetime to produce high-quality films.

An exemplary high purity 6N Cu target assembly in accordance with the present invention is shown in FIG. 2a. FIG. 2a shows a sputter face 201 of the 6N Cu target assembly 200 that is configured within a sputtering tool 204. The assembly 200 includes a 6N Cu target 202 that is directly bonded to a copper alloy backing plate 203. The 6N Cu target 202 as shown in FIG. 2a is defined by a thickness of about 0.9 inches and a diameter of about 19 inches configured to produce 300 mm wafers that are coated with Cu films. It should be understood that the present invention contemplates other thicknesses and diameters for the 6N Cu target. For example, the 6N Cu target of the present invention has a thickness that ranges from of 0.25 to 1.25 inches or greater, preferably 0.5 inches to 1.25 inches, and more preferably 0.75 inches to 1.125 inches. The 6N Cu target has a diameter that ranges from 15 inches to 24 inches or higher, preferably 15 to 21 and more preferably 15 to 19.5.

Still referring to FIG. 2a, the target assembly 200 has undergone sputtering to an extent where about 50% of the target has been eroded at power levels that were gradually increased during sputtering from a starting power of 20 kW to 40 kW and then 56 kW. FIG. 2a shows the state of the target sputter face after a lifetime of about 850 kWh such that about 50% of the target has been eroded. As can be seen in FIG. 2a, no visible macro grain coarsening has occurred along the sputter face 201 of the target 202 after 850 kWh. The bond strength was sufficient to prevent debonding and warpage of the target 202. FIG. 2 shows that the target 202 has remained adequately bonded to the backing plate 203. The ability to maintain bond strength at such power levels and also avoid coarsening of copper grains along the interface and the bulk region for 6N purity Cu is a significant improvement over conventional 6N or higher purity Cu target assemblies, which typically have only been able to maintain bond strength at the expense of grain coarsening, or, alternatively, retain fine grain size structure at the expense of insufficient bond strength (i.e., warpage and/or debonding). The ability for the target assembly 200 to withstand such high sputter power over many hours is dependent at least in part on the bond strength. The bond strength of the present invention is sufficient to prevent debonding of the target from the backing plate during sputtering to an end life of about 1750 kWh. In a preferred embodiment, the present invention is directed to bond strengths of 1280 pound force (lbf) or higher and more preferably 1500 lbf or higher. The measured bond strength of the target of FIG. 2a was measured to have an average bond separation force of about 2550 pound force (lbf). The technique for evaluating such bond separation force is described in U.S. Pat. No. 6,092,427, which is incorporated herein by reference in its entirety. This bond strength is equivalent to 23 ksi in tensile testing.

In this manner, the present invention solves a common problem in the industry by offering a unique 6N Cu target assembly that can exhibit properties previously considered mutually exclusive. FIG. 2a shows that the structural integrity and absence of coarse grains of the target assembly would allow sputtering to continue if desired.

Figure 2B:

FIG. 2b is a digital photograph that shows a cross-sectional macrostructure of the assembly 200 of FIG. 2a. No grain coarsening has occurred along the bonded interface 205. Additionally, no grain coarsening has occurred in the bulk region of the target 201. The grains have an average size of about 30 microns with a variation of no more than +/−2.9%. It should be understood that the present invention also contemplates an average grain size ranging from about 20 to 50 microns, preferably 20 to 40 microns and more preferably 25 to 35 microns. Previous 6N or higher purity target assemblies have exhibited unacceptable microstructure, and particularly, along the bonded interface. Moreover, previous 6N Cu target assemblies have been unable to achieve the fine grain structure at the higher thicknesses and diameters of the present invention.

Figure 3A:
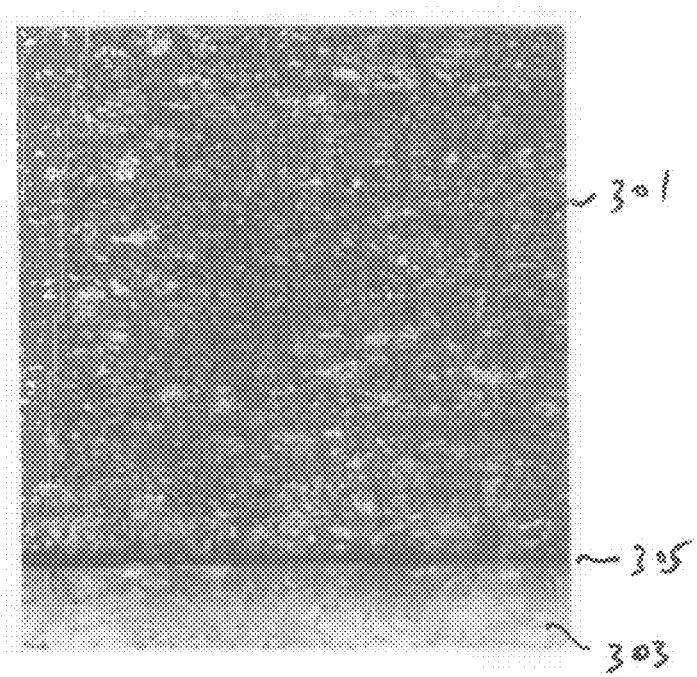
FIGS. 3a and 3b show optical micrographs of the microstructure of the target of FIGS. 2a and 2b.
Figure 3B:
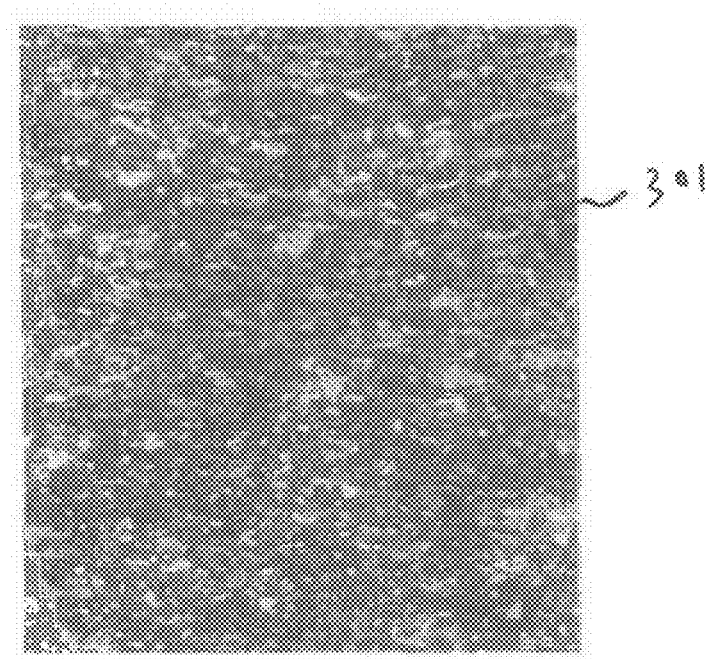

Another positive attribute of the present invention is the ability to maintain microstructure homogeneity from the interface to the bulk region of the 6N Cu target assembly. In this regard, FIGS. 3a and 3b show optical micrographs of the microstructure of the target 201 of FIGS. 2a and 2b. FIG. 3a shows the localized microstructure about the interface 305 between the target 301 and the backing plate 303. FIG. 3b shows the localized microstructure in the bulk material 302 of the target. As can be seen, the localized grain structure 301 in close vicinity to the interface 305 (FIG. 3a) is substantially similar to that of the bulk grain structure 302 (FIG. 3b) extending farther away from the interface 305.

Figure 4A:
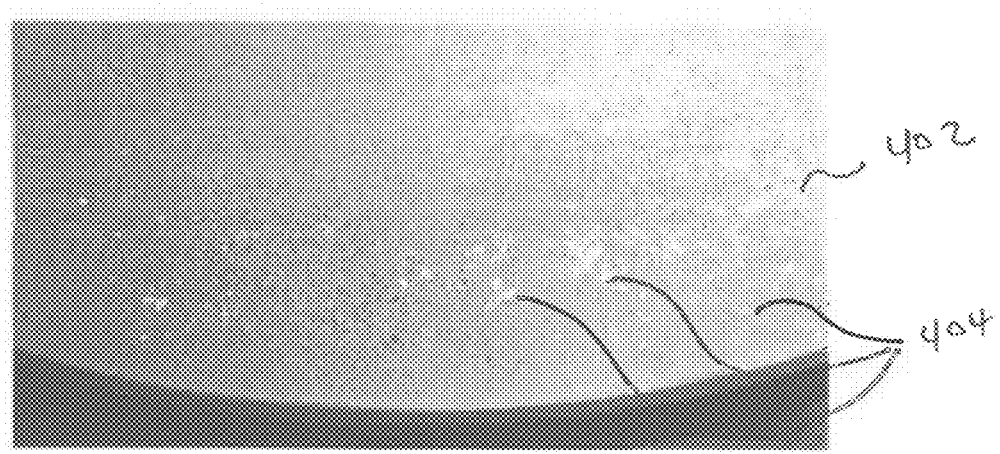
FIG. 4a shows a target blank with coarse grains prior to being diffusion bonded to a backing plate.
Figure 4B:
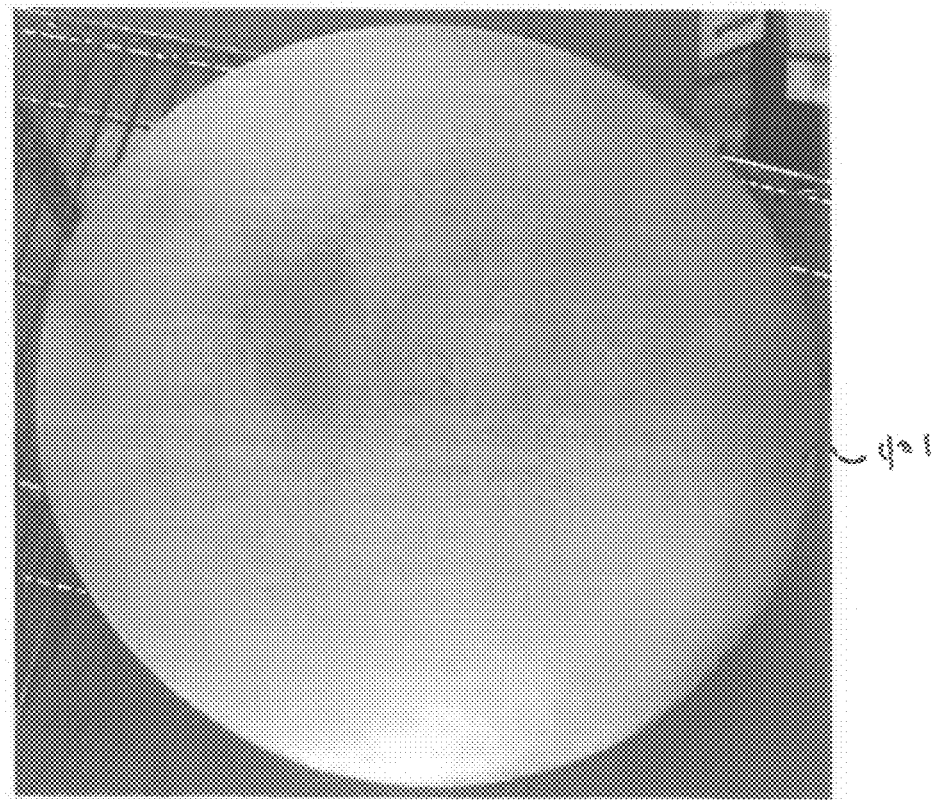
FIG. 4b shows a target blank without coarse grains prior to being diffusion bonded to a backing plate.

Furthermore, and of significance, the localized grain structure at the interface 305 (FIG. 3a) and the grain structure extending away from the interface into the bulk grain structure (FIG. 3b) remain substantially non-altered from that of the 6N target blank 401 (FIG. 4b). FIG. 4b shows that there are no coarse grains in the target blank. The grains of the target blank 401 have (111), (200), (220) and (311) orientations with the amount of the grains having each of such orientations being less than 50 percent. The grains of the target blank 401 are substantially non-equiaxed in a manner that does not create preferred grain orientation or texture. Advantageously, the present invention is able to retain the fine grain structure of the target blank 401 into the diffusion bonded assembly 200 of FIGS. 2a and 2b having a homogenous fine grained structure.

In comparison, FIG. 4a shows a 6N Cu target blank 402 that contains coarse grains 404, particularly at the periphery, but also throughout the bulk material. Employing such a target blank 402 in a diffusion bonding process maintains or worsens the grain inhomogeneity in the resultant bonded target assembly such that many localized regions or pockets of coarse grains are produced which are not suitable for sputtering. Accordingly, the present invention recognizes the need to maintain purity levels of 6N or higher in the target blank.

In accordance with the principles of the present invention, the grains have an absence of micro-alloying stabilizing agents. Unlike conventional 6N Cu and higher targets, the present invention has surprisingly demonstrated the ability to control grain size and grain structure without the introduction of alloying solutes to pin down the movement of grains. Conventional 6N or higher purity Cu targets have typically relied upon alloying in order to counteract grain boundary movement and transformation-of grains that grow larger in size and more non-uniform in size during diffusion bonding. 6N Cu material contains orders of magnitude less solute in comparison to 5N Cu material. This reduction in alloying solutes in 6N and higher purity Cu material enhances grain mobility at the required diffusion bonding temperatures. The absence of micro-alloying stabilizing agents translates into a substantial absence of secondary phase alloy precipitates. In this manner, sputter performance of the inventive target assembly is potentially enhanced in terms of reduction or elimination of localized arcing during sputtering. Furthermore, risk of depositing splats (i.e., large particles) can be minimized. The inventive 6N targets in this respect can therefore outperform conventional 6N targets.

By virtue of not introducing alloying materials or other additives, the aggregate metallic impurity in the bonded target assembly is no more than about 1 ppm. Metallic impurities may include any metals typically contained within the starting 6N Cu or higher purity ingot or billet material utilized for manufacturing the target blank, such as, by way of example, manganese, indium, silver, tin and magnesium. Total metallic impurities are preferably less than about 1.0 ppm, more preferably less than about 0.90 ppm and most preferably less than about 0.85 ppm.

The ability to avoid anomalous grain growth during diffusion bonding and retain the fine sized grain structure without the introduction of micro-alloying stabilizing elements in the bonded 6N Cu target assembly, as well as during sputtering (FIGS. 2a and 2b) is a significant improvement over conventional bonded 6N Cu assemblies. The design attributes of the present invention are in stark contrast to conventional 6N or higher purity copper target assemblies, which generally must rely on purity levels below 6N to achieve controlled grain size.

Figure 5:
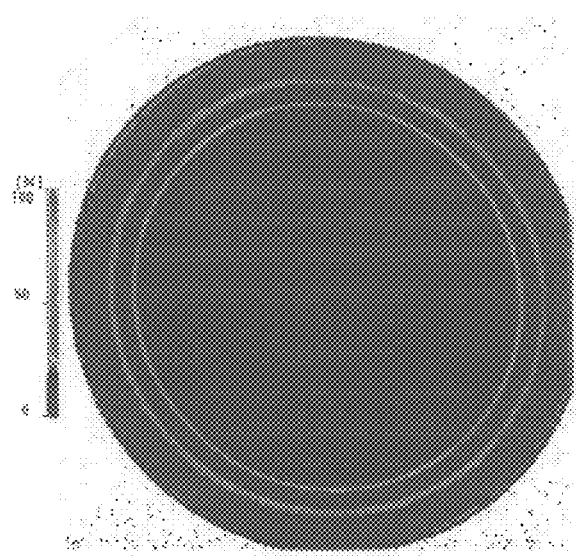
FIG. 5 shows an ultrasound bond coverage map of the target assembly of the present invention.

Preferably, the interface 205 of the present invention is substantially flat, whereby the interface 205 is characterized by the absence of an interlayer. Referring to FIG. 2b, the direct bonding of the mating surface of the target 202 to a mating surface of the backing plate 203 occurs such that substantially all of the areas for both mating surfaces are in direct contact with each other. In this regard, FIG. 5 shows an ultrasonic scan of the mating surfaces. The blue and red profiles indicate complete bond coverage regions between the target 202 and the backing plate 203. The flat interface 205 is particularly advantageous for 6N Cu and higher purity levels in which the resultant bonded assembly 200 may exhibit several advantages. For example, an increased lifetime of the 6N Cu or higher purity target may be achieved whereby increased material yield of the target 201 is attainable in comparison to 6N Cu or higher target assemblies of FIG. 1 or other target assemblies which must rely on substantially non-flat interfaces to produce the necessary bond strength along the mating surfaces of the target and the backing plate. Furthermore, the substantially flat interface may allow improved sputtering performance up to end-of-life of the target without encountering any plasma ignition problems as typically encountered in the industry with 6N Cu and other types of targets.

The substantially flat bonded interface 205 has a significant reduction or absence of voids and/or inclusions therein. The absence of voids and/or inclusions (e.g., CuO) in combination with a fine grain size characterized by the absence of coarse grains at the interface may improve sputter performance. Further, reduction in the likelihood of localized heating, thereby reducing or preventing formation of splat defects during copper film deposition on 300 mm wafers. As used herein, splats are large defects of 500 microns or more contained the deposited films. Splats affect device yield by shorting metal lines. A significant amount of all in-film defects produced in current interconnect metallization processes are induced, splat-type defects.

Furthermore, the absence of voids and/or inclusions in combination with a fine grain size at the interface may provide enhanced bond strength. Generally speaking for 6N and higher purity Cu targets, the large grain sizes can result in a soft and low bond strength target. Low bond strength targets are susceptible to mechanical failure during overheating and arcing. For example, localized heating due to a void and/or an inclusion can lead to substantial localized thermal gradients that may fracture and dislodge a low bond strength portion of the target. The dislodged target material can produce splats. As can be seen, in contrast to conventional 6N or higher purity Cu films, the ability to retain fine microstructure at the interface and maintain bond strength provides a synergism of improved sputter performance that ultimately can improve the Cu film which is deposited on 300 mm wafers.

Although a flat interface 205 as shown in FIG. 2b is preferred and offers many process benefits during sputtering, it should be understood that the present invention contemplates other types of interfaces which may be suitable for some sputtering applications. By way of example, the interface may be modified from a substantially flat interface to a more-grooved or jagged interface, whereby such groove features along the mating surface of the backing plate interlock with complementary grooves along the mating surface of the target. Construction of grooved interfaces may be carried out by any means as known in the art and may be designed to contain any shape and size.

As mentioned, applicants have demonstrated the inventive 6N target assembly can achieve and maintain sufficient bond strength, whereby debonding does not occur at power levels up to about 56 kWH, while simultaneously maintaining a substantially homogenous and fine grain size structure that remains substantially unaltered from the precursor target blank as shown in FIG. 4b. The precursor target blank has the required thickness and diameter for production of 300 mm or greater diameter wafers as described and shown in FIG. 4b. Furthermore, the blank does not contain coarse grains.

The target blank is converted from a billet by a combination of heat treatment, hot working, cold working and annealing operations which incrementally reduce the starting billet thickness to a target blank thickness suitable for making the inventive 6N or higher purity target assemblies in a manner that provides uniform deformation and strain of the worked 6N Cu material to attain a target blank with the requisite grain microstructure as described in FIGS. 2a and 2b. The hot working conditions comprise elevated temperatures ranging from about 400 C to about 650 C, preferably 400 C to 500 C and more preferably 400 C to 450 C for durations ranging from about 1 hour to about 4 hours, preferably 2 hours to about 4 hours and more preferably about 2 hour to about 3 hours. Hot pressing can be utilized to reduce the starting thickness of the billet to an intermediate thickness. For example, a 6N purity Cu billet of diameter 7.0 inches and cut length of 6.2 inches (i.e., initial billet thickness) can be hot worked utilizing hot pressing to attain a deformation ranging from about 27 to about 67%, more preferably, 30 to 50%, and most preferably 35 to 45%. Air cooling may be employed after the hot pressing. Next, the intermediate sized billet is preferably cold worked to attain deformation ranging from about 60-90%, preferably 70-85% and more preferably 75-85% so that the target blank diameter and thickness is produced. The blank is subsequently annealed at a temperature and time sufficient to create a substantially homogenous microstructure and size without the occurrence of secondary recrystallization. In one example, the annealing conditions range from 250-450° C., preferably 275-400° C. and more preferably 300-350° C. for a duration of 1-8 hours, preferably 2-7 hours and more preferably 3-6 hours.

Having produced the blank as shown in FIG. 4b, diffusion bonding of the blank to the backing plate can occur. First, the target blank and backing plate (e.g., copper alloy backing plate) are machined by known methods into the desired shape and orientation. The machined target blank and machined backing plates are then cleaned and vacuum sealed in a metallic can apparatus. Preferably, the mating surfaces of the target blank and the backing plate are substantially flat and characterized by the absence of grooves, jagged features, inclusions and/or voids therealong. Hot isostatic pressing may be subsequently performed. Inert gas such as argon is introduced into the chamber to generate a pressure of about 15-40 ksi, preferably 20-35 ksi and more preferably 25-30 ksi. The temperature is increased to 200-380° C., preferably 225-300° C. and more preferably 250-300° C. for a duration of 1-7 hours, preferably 2-6 hours and more preferably 3-5 hours. During this established temperature and pressure cycle, Cu atoms from the target blank and the backing plate inter-diffuse to form a bonded interface. Of particular significance, the temperature does not exceed a critical temperature at which substantially modification and/or alteration of the grain size and structure of the target blank would occur. As a result, the diffusion bonding occurs in a manner that retains fine grain size and homogeneity both at the interface and in the bulk structure while still producing sufficient bond strength by virtue of the bonding pressure. Subsequently, the bonded assemblies are brought to room temperature and the surfaces are cleaned prior to bond coverage evaluation using the ultrasound method previously described and as shown in FIG. 5.

The fine microstructure and bond strength of the bonded 6N Cu target assembly of FIG. 5 translates into improved sputter performance. In particular, the 6N Cu target assembly can be sputtered up to end-of-life in the sputter tool shown in FIG. 1a to produce high purity Cu films on 300 mm Si wafers without incurring debonding and significant warpage. Such improved process benefits can incur at power levels ranging from about 20 kW to about 56 kW. Additionally, the target assembly can be sputtered without incurring microstructural variation in the bulk or at the bonded interface.

Figure 6:
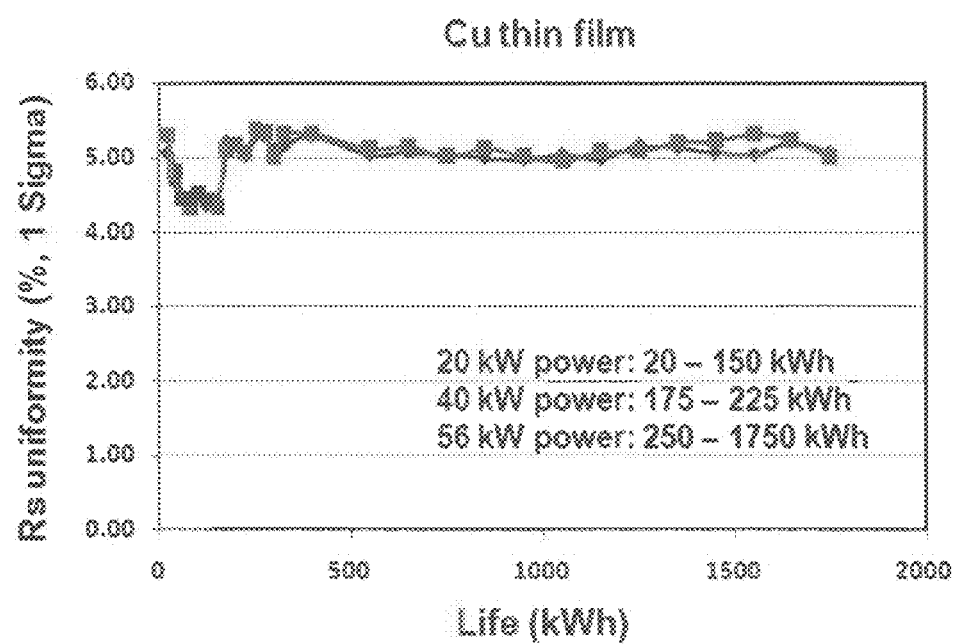
FIG. 6 shows Cu thin film Rs uniformity variation (%; 1 standard deviation) as a function of life at various power levels.

FIG. 6 shows that the deposited Cu films were produced with an absence of splats (e.g., 500 microns or larger) in the film and controlled surface resistivity (Rs) uniformity. FIG. 6 shows that the 6N target assembly was sputtered at a power of 20 kW for up to 150 kWh life; then sputtered at a power of 40 kW for up to 225 kWh life; and then sputtered at a power of 56 kW for up to 1750 kWh of life. The Rs uniformity was obtained from 49 point measurements utilizing a four point probe as known in the art. Rs uniformity variation remained lower than 5.5% which represent 1 sigma of standard deviation. The Rs uniformity data shows that the sputter target assembly of the present invention can be sputtered in a substantially uniform manner to generate substantially controlled Rs uniformity data. In contrast to conventional 6N or greater purity Cu sputter targets, the present invention has a combination of relatively small and uniform grain size and sufficient bond strength characterized by the absence of voids and inclusions therein that can synergistically interact to provide a high purity Cu target assembly capable of improved sputtering performance for deposition of high quality Cu films onto 300 mm or larger diameter wafers with enhanced properties. Conventional 6N or greater purity Cu target assemblies cannot maintain bond strength during high power sputtering to end-of-life. Alternatively, if such conventional assemblies can maintain bond strength, grain coarsening occurs with many regions having, for example, 100-200 microns or greater. The presence of such coarse grains negatively affects quality and uniformity of thin films produced utilizing such targets. Further, the coarse grains results in a soft, low bond strength target that is generally susceptible to mechanical failure during overheating and arcing. Moreover, these detriments are magnified as the thickness and diameter is increased to that of the present invention for production of targets capable of sputtering films onto 300 mm or greater diameter wafers.

While it has been shown and described what is considered to be certain embodiments of the invention, it will, of course, be understood that various modifications and changes in form or detail can readily be made without departing from the spirit and scope of the invention. For example, while many of the illustrated embodiments relate to 6N purity Cu target assemblies, it should be understood that the principles of the present invention are applicable to greater than 6N purity level Cu target assemblies as well as target assemblies having a diameter and thickness suitable for greater than 300 mm wafers. It is, therefore, intended that this invention not be limited to the exact form and detail herein shown and described, nor to anything less than the whole of the invention herein disclosed and hereinafter claimed.

The invention claimed is:

1. A sputtering target assembly comprising:
a backing plate; and
a copper-containing target defined by a thickness of at least about 0.8 inches and a diameter of at least about 19 inches configured to produce 300 mm or greater diameter wafers coated with Cu films, said target being diffusion bonded directly to the backing plate to create a substantially flat interface, said interface is characterized by the absence of an interlayer and voids, said interface having a bond strength of about 1280 pound force or greater to prevent debonding of the target from the backing plate during sputtering at power levels of at least about 20 kW;
said target consisting essentially of 99.9999 wt % Cu (6N Cu) or higher, wherein said target is characterized by the absence of alloying stabilizer elements; and
wherein said target comprises grains with an average grain size equal to or less than about 30 microns.

2. The target assembly of claim 1, wherein said target comprises total metallic impurities less than or equal to about 1 ppm.

3. The target assembly of claim 1, wherein said grains of the target are configured in (111), (200), (220) and (311) orientations with the amount of the grains having each of the orientations being less than 50 percent.

4. The target assembly of claim 1, wherein said average grain size has a variation of no more than +/−2.9%.

5. The target assembly of claim 1, wherein said grains have a localized microstructure at the interface and said grains located away from the interface have a bulk grain structure, said localized microstructure at the interface being substantially similar to that of the bulk grain structure.

6. A film produced by the target assembly of claim 1 having improved Rs uniformity in comparison to a target having coarse grains at the interface.

7. The film of claim 6, wherein said film has a Rs of no greater that about 5.5%.

8. The target assembly of claim 1 wherein the target has a surface roughness of 16 micro-inches.

9. The target assembly of claim 1 configured within a sputtering tool.

10. The target assembly of claim 1, wherein said backing plate comprises a Rockwell hardness ($R_B$) of at least about 90.

11. The target assembly of claim 1, wherein said sputtering power levels is at least about 20 kW.

12. The target assembly of claim 1, wherein said flat interface is substantially void and inclusions free.

13. The target assembly of claim 5, wherein said target is derived from a target blank, and further wherein said grain size of said target at the interface remains substantially unaltered from that of the target blank.

14. The target assembly of claim 5, said grains have a microstructure characterized by an absence of coarse grains at the interface and in the bulk region of the target assembly.

15. A sputtering target assembly comprising:
a backing plate; and
a copper-containing target defined by a thickness and diameter configured to produce 300 mm or greater wafers coated with Cu films, said target being diffusion bonded directly to the backing plate to create an interface, said interface having a bond strength sufficient to prevent debonding of the target from the backing plate during sputtering at power levels of at least about 20 kWh;
said target consisting essentially of 99.9999 wt % Cu (6N Cu) or higher, wherein said target is characterized by the absence of alloying stabilizer elements;
said target having grains with an average grain size equal to or less than about 30 microns, said grain size having a variation of no more than about +/−2.9% variation;
wherein said grains have a localized microstructure at the interface and said grains located away from the interface have a bulk grain structure, said localized microstructure at the interface being substantially similar to that of the bulk grain structure.

16. The sputtering target assembly of claim 15, wherein said interface comprises grooves.

17. The sputtering target assembly of claim 15, wherein said interface is substantially flat.

18. The sputtering target assembly of claim 15, wherein said target is derived from a target blank characterized by an absence of coarse grains.

* * * * *